US012748168B2

(12) United States Patent
Andia Vera et al.

(10) Patent No.: US 12,748,168 B2
(45) Date of Patent: Sep. 29, 2026

(54) MAGNETIC RESONANCE IMAGING APPARATUS PROVIDED WITH A MAGNETIC ASSEMBLY

(71) Applicant: Multiwave Technologies AG, Plan les Ouates (CH)

(72) Inventors: Gianfranco Andia Vera, Marseilles cedex (FR); Chloé Cabon, Marseilles cedex (FR); Fouad Fezari, Marseilles cedex (FR); Djamel Berrahou, Marseilles cedex (FR); Marc Dubois, Marseilles cedex (FR); Tryfon Antonakakis, Marseilles cedex (FR)

(73) Assignee: Multiwave Technologies AG, Plan les Ouates (CH)

( * ) Notice: Subject to any disclaimer, the term of this patent is extended or adjusted under 35 U.S.C. 154(b) by 177 days.

(21) Appl. No.: 18/717,777

(22) PCT Filed: Dec. 8, 2022

(86) PCT No.: PCT/EP2022/084933
§ 371 (c)(1),
(2) Date: Jun. 7, 2024

(87) PCT Pub. No.: WO2023/104948
PCT Pub. Date: Jun. 15, 2023

(65) Prior Publication Data

US 2025/0123344 A1 Apr. 17, 2025

(30) Foreign Application Priority Data

Dec. 10, 2021 (FR) ...................................... 2113329

(51) Int. Cl.

| | |
|---|---|
| ***G01V 3/00*** | (2006.01) |
| ***G01R 33/38*** | (2006.01) |
| ***G01R 33/383*** | (2006.01) |

(52) U.S. Cl.
CPC ....... *G01R 33/3802* (2013.01); *G01R 33/383* (2013.01)

(58) Field of Classification Search
CPC .......................... G01R 33/3802; G01R 33/383
(Continued)

(56) References Cited

U.S. PATENT DOCUMENTS

| | | | |
|---|---|---|---|
| 2015/0335261 | A1 | 11/2015 | Rapoport |
| 2019/0101607 | A1 | 4/2019 | Rothberg et al. |

FOREIGN PATENT DOCUMENTS

| | | | |
|---|---|---|---|
| CN | 109031437 A | * 12/2018 | .............. G01V 3/32 |
| CN | 209884145 | 1/2020 | |
| CN | 113640723 A | 11/2021 | |

OTHER PUBLICATIONS

Binitha et al., A Survey of Bio Inspired Optimization Algorithms, International Journal of Soft Computing and Engineering (IJSCE), vol. 2, Issue 2, (May 2012), pp. 137-151.

(Continued)

*Primary Examiner* — Walter L Lindsay, Jr.
*Assistant Examiner* — Frederick Wenderoth
(74) *Attorney, Agent, or Firm* — TraskBritt

(57) ABSTRACT

An imaging apparatus comprising: at least a first module comprising a trolley provided with a plate on one face of which rests a magnetic assembly intended to apply a main magnetic field in an analysis zone of a main housing of the magnetic assembly, the trolley additionally comprising two side walls supporting the plate via one of their edges, designated the upper edge; a second module of substantially parallelepipedal shape, supporting a set of electronic control elements, the console being, in particular, configured to be inserted between the side walls of the trolley; the console and the first module comprising means of identification, by the console, of the geometric and magnetic features of the (Continued)

magnetic assembly of the first module, the means of identification being integrated in connection means.

20 Claims, 7 Drawing Sheets

(58) Field of Classification Search
USPC .......................................................... 324/322
See application file for complete search history.

(56) References Cited

OTHER PUBLICATIONS

French Search Report for Application No. 2113329 dated Aug. 9, 2022, 2 pages.
International Search Report for Application No. PCT/EP2022/084933 dated Mar. 27, 2023, 3 pages.
International Written Opinion for Application No. PCT/EP2022/084933 dated Mar. 27, 2023, 13 pages with machine translation.

* cited by examiner

MAGNETIC RESONANCE IMAGING APPARATUS PROVIDED WITH A MAGNETIC ASSEMBLY

CROSS-REFERENCE TO RELATED APPLICATIONS

This application is a national phase entry under 35 U.S.C. § 371 of International Patent Application PCT/EP2022/084933, filed Dec. 8, 2022, designating the United States of America and published as International Patent Publication WO 2023/104948 A1 on Jun. 15, 2023, which claims the benefit under Article 8 of the Patent Cooperation Treaty of French Patent Application Serial No. FR2113329, filed Dec. 10, 2021.

TECHNICAL FIELD

The present disclosure relates to the field of magnetic resonance imaging. More particularly, the present disclosure relates to a magnetic resonance imaging apparatus and, in particular, a magnetic resonance imaging apparatus provided with a magnetic assembly capable of imposing a main magnetic field in an analysis zone.

BACKGROUND

Magnetic resonance imaging (MRI) is currently widely used to image, non-invasively, the interior of bodies and, in particular, human bodies. Magnetic resonance imaging makes it possible to probe the hydrogen nuclei and, in particular, their nuclear spin, of water molecules forming part of the body.

In this respect, an MRI apparatus is provided with a magnet intended to impose on the body a static magnetic field (called “main magnetic field”), under the effect of which the nuclear spins associated with the hydrogen nuclei contained in the water molecules forming part of this body polarize.

In particular, the magnetic moments associated with these spins are preferentially aligned along an axis called the z axis, determined by the orientation of the main magnetic field so as to create a magnetization of the body.

An MRI apparatus also comprises gradient coils configured to produce magnetic fields of small amplitude and varying in space when a current is applied thereto. More particularly, the gradient coils are designed to produce a magnetic field component that is aligned parallel to the main magnetic field and that varies linearly in amplitude with the position along one of the axes x, y, or z (with each pair of axes x, y, and z being perpendicular).

Thus, the combined effects of the magnetic fields imposed by the gradient coils make it possible to spatially encode each of the positions of the body intended to be probed.

An MRI apparatus also comprises at least one radiofrequency (RF) coil intended to act as an RF receiver transmitter. In particular, the at least one radiofrequency coil is configured to emit RF energy pulses of a frequency equal to or close to the resonance frequency of the hydrogen nuclei spins and that is at least partially absorbed by these nuclei.

As soon as the RF emission is interrupted, the nuclear spins relax in order to return to their initial energy state and in turn emit an RF signal capable of being collected by at least one RF coil. This RF signal is then processed using a computer and reconstruction algorithms in order to obtain an image of the body.

The main magnetic field, generally of magnetic flux density between 1.5 Tesla and 3 Tesla, makes it possible to achieve relatively reasonable signal-to-noise ratios and consequently to form images of the human body of sufficient quality and the duration on the order of one minute or more.

However, there are circumstances in which it is not possible to implement a main magnetic field of such an intensity. Portable MRI apparatuses are an example thereof. The latter generally comprises a permanent magnet or electromagnets of limited capacity and cannot impose a main magnetic field with an intensity greater than 60 mT, or even greater than 200 mT, without adversely affecting the mass or bulk of the MRI apparatus considered.

This limitation in terms of main magnetic field intensity directly affects the performance of the MRI apparatus. The improvement in the uniformity of the main magnetic field may therefore be essential.

An object of the present disclosure is to propose a magnetic resonance imaging apparatus that enables the analysis of different parts of the body regardless of their size without degrading the quality of the images that can be obtained on these various body parts.

Another object of the present disclosure is to propose a magnetic resonance imaging apparatus, advantageously implementing a main magnetic field of low intensity, provided with a magnetic assembly where the uniformity of the magnetic field created is improved with respect to the assemblies known from the prior art.

BRIEF SUMMARY

The object of the disclosure is achieved by a magnetic resonance imaging apparatus that comprises:

- at least one first module, each first module from the at least one first module comprising a trolley provided with a plate on a face of which, called the upper face, rests a magnetic assembly, the magnetic assembly being intended to impose a main magnetic field in an analysis zone of a main recess of the magnetic assembly, the trolley further comprising two side walls supporting by one of their edges, called the upper edge;
- a second module, provided with a console, of substantially parallelepiped shape, supporting a set of electronic control elements of the apparatus; the console is configured, in particular, to be inserted, by a sliding connection, between the side walls of the trolley of each first module among the at least one first module;
- both modules of the console and the at least a first module comprise means for identifying, by the console, geometric and magnetic features of the magnetic assembly of the first module, the identification means being integrated into connection means of the console and of the first module.

According to an embodiment, the magnetic assembly comprises:

- a plurality of support plates, each having an annular section delimiting an opening, referred to as the support opening, the support plates being assembled together, by alignment means, along a main axis, so that the support openings, aligned along the main axis, delimit a main recess of generally cylindrical shape; each support plate further comprising a first plurality of permanent magnets, housed in first housings provided in the annular section, along at least one annular Halbach array around the main axis, the set of magnets of the first plurality of magnets creating a primary magnetic field in a zone, called analysis zone, of the main housing that presents a first uniformity;

a plurality of annular parts assembled coaxially with annular sections, and rigidly connected to the support plates, each annular part comprising a second plurality of magnets housed in second recesses provided in the annular part, the set of annular parts being arranged so as to create a secondary magnetic field in the analysis zone so that the resultant of the primary magnetic field and of the secondary magnetic field, called the main field, in the analysis zone, has a second improved uniformity with respect to the first uniformity.

According to one embodiment, the magnetic assembly comprises a main part inserted between two secondary parts, the main part consisting of support plates, called main support plates, and both secondary parts being formed by support plates called secondary support plates, the opening of the main support plates, called first opening, has a first diameter, while the opening of the secondary support plates, called second opening, has a second diameter less than the first diameter.

According to one embodiment, the support plates comprise a non-magnetic material, advantageously, the non-magnetic material comprises aluminum, a plastic material, for example, PMMA plexiglass.

According to one embodiment, the alignment means comprise threaded rods essentially parallel to the main axis and now secured to one another, the support plates.

According to one embodiment, each support plate is enclosed between two cover plates by gripping means, the two cover plates being configured to retain the magnets of the first plurality of magnets in the first cavities of the support plate under consideration, the gripping means advantageously comprising nuts cooperating with the threaded rods.

According to one embodiment, each support plate comprises an opening, called an alignment opening, so that the magnetic assembly comprises at least one alignment passage of square or rectangular cross-section formed by the alignment openings, and which extends parallel to the main axis; the magnetic assembly further comprising at least one alignment tube passing through the alignment passage, and having a shape in accordance with the cross-section of the passage, the at least one alignment tube being intended to fix the magnetic assembly to a trolley.

According to one embodiment, each support plate comprises a first plate and a second plate assembled against one another by a contact face, the first recesses each comprising two cavities formed from the contact face of one and/or the other of the first plate and the second plate.

According to one embodiment, the alignment means comprise at least one rail provided with alignment notches, each alignment notch holding a support plate, the notches being configured to maintain a predetermined spacing into two adjacent support plates.

According to one embodiment, the alignment means comprise an alignment element provided with a base topped by a cradle hole on a cylinder portion on an inner surface of which grooves are formed, each of the support plates being held in a groove specific to it.

According to one embodiment, each support plate comprises an outer tongue that extends radially to the annular section, which is inserted into a cavity formed at the bottom of the groove holding the support plate.

According to one embodiment, the annular parts are held together with the plurality of support plates by threaded rods, called auxiliary threaded rods.

According to one embodiment, the support plates comprise internal or external tabs wherein housings are formed that are able to house one or several permanent magnets.

According to one embodiment, the annular parts are arranged in the main housing.

According to one embodiment, the annular parts are arranged externally to the main housing, each annular part is inserted between two support plates.

According to one embodiment, the magnetic assembly further comprising a radiofrequency coil and gradient coils arranged in the main housing and mechanically integral with the magnetic assembly.

According to one embodiment, the radiofrequency coil and the gradient coils are removable.

BRIEF DESCRIPTION OF THE DRAWINGS

Other characteristics and advantages of the disclosure will emerge from the following detailed description of embodiments of the present disclosure with reference to the accompanying figures, in which.

DETAILED DESCRIPTION

Figure 1:
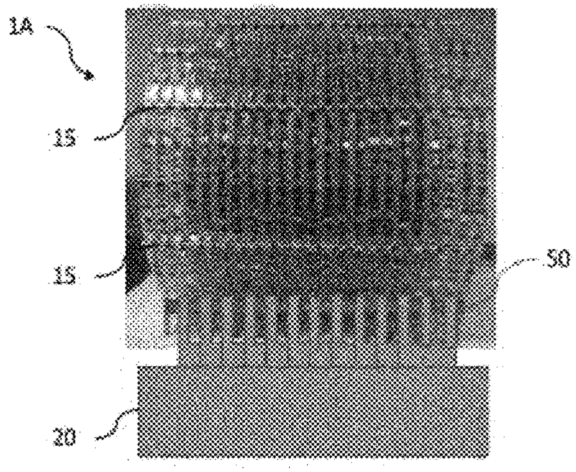
FIG. 1 is a photograph of a magnetic assembly of an imaging apparatus according to a first embodiment of the present disclosure.

The disclosure relates to a magnetic resonance imaging apparatus that comprises:

at least one first module, each first module from the at least one first module comprising a trolley provided with a plate on a face of which, called the upper face, rests a magnetic assembly, the magnetic assembly being intended to impose a main magnetic field in an analysis zone of a main recess of the magnetic assembly, the trolley further comprising two side walls supporting the plate via one of their edges, called upper edge, a second module, provided with an essentially parallelepiped console, supporting a set of electronic control elements of the apparatus, the console is configured, in particular, to be inserted, by a sliding connection, between the side walls of the trolley of each first module from the at least one first module;

both modules of the console and the at least a first module comprise means for identifying, by the console, geometric and magnetic features of the magnetic assembly of the first module by the console, the identification means being integrated into connection means of the console and of the first module.

The magnetic assembly is, in particular, intended to impose, on a body, a static magnetic field, under the effect of which the nuclear spins associated with the hydrogen nuclei contained in the water molecules partly forming this body polarize.

In particular, the magnetic assembly comprises a plurality of support plates, each having an annular section delimiting an opening, called a support opening. More particularly, the support plates are assembled integrally with each other by alignment means, along a main axis, so that the support openings, aligned along the main axis, delimit a main housing of generally cylindrical shape. Each support plate further comprising a first plurality of permanent magnets, housed in first housings provided in the annular section, according to at least one annular Halbach array around the main axis. The assembly of support plates is arranged, in particular, to create a primary magnetic field in a zone, called an analysis zone, of the main housing that presents a first uniformity.

The magnetic assembly also comprises annular parts arranged coaxially to the annular sections and secured to the support plates. Each annular part comprises a second plurality of magnets housed in second housings provided in the annular part. The annular parts are, in this respect, arranged so as to create a secondary magnetic field in the analysis zone so that the resultant of the primary magnetic field and of the secondary magnetic field, called the main field, in the analysis zone, has a second uniformity improved with regard to the first uniformity.

According to the present disclosure, it is understood that the analysis zone comprises a central section of the main housing. It is also understood that the analysis zone is at least delimited by the annular parts positioned at both ends, along the main axis, of the assembly formed by the annular parts.

"Uniformity of a magnetic field" is understood to mean a spatial variation of the magnetic field in the analysis zone. According to the present disclosure, the spatial variation of the magnetic field can be, in particular, characterized by the difference between the maximum magnetic field and the minimum magnetic field observed in the analysis zone. Thus, according to the principles of the present disclosure, the lower this difference, the better the uniformity.

The modular character of the imaging apparatus according to the present disclosure makes it possible to consider different first modules, each first module being adapted for the analysis of a particular section of a body. In particular, a first module can be considered for the analysis of the cranium and another first module suitable for analyzing a limb, in particular, a leg.

In FIG. 1, a magnetic assembly 1A of an imaging apparatus 1 (not shown) by magnetic resonance according to a first embodiment of the present disclosure is shown.

The magnetic assembly 1A comprises, in particular, a plurality of support plates 10. Each support plate 10 is generally planar in shape and comprises two main faces essentially parallel to one another. A support plate 10 may comprise a non-magnetic material and, in particular, aluminum, or a plastic material, for example, PMMA plexiglass.

Figure 2:
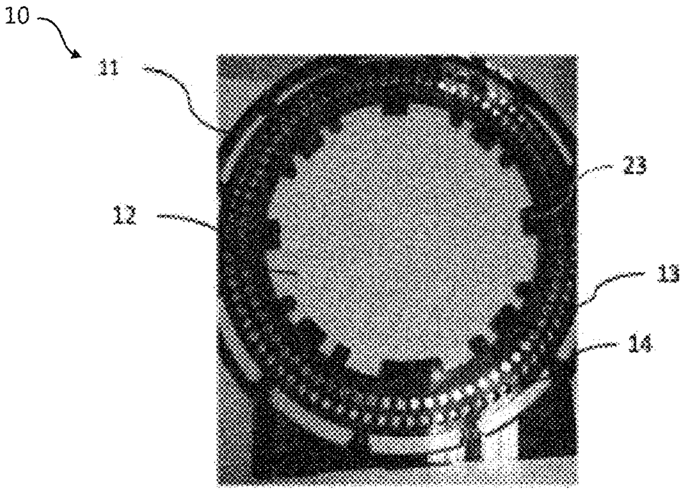
FIG. 2 is a photograph of a support plate capable of being implemented in the context of the first embodiment of the present disclosure.

As shown in FIG. 2, a support plate 10 comprises an annular section 11 that delimits a support opening 12, opening onto each of the two main faces.

The support plate 10 also comprises a plurality of through openings, also opening onto each of the two main faces, and forming housings, called first recesses 14. More particularly, the first recesses 14 are formed on the annular section 11 of the support plate 10 in question. In particular, and as shown in FIG. 2, the first recesses 14 are arranged in the form of two concentric rings.

The magnetic assembly 1A also comprises a first plurality of permanent magnets 13. The choice of these magnets is left to the assessment of a person skilled in the art.

The magnets 13 are, in particular, housed individually in the first recesses in order to form an annular Halbach array. More particularly, with continued reference to FIG. 2, the annular Halbach array comprises two series of magnets 13 forming two concentric rings. However, the present disclosure is not limited to these aspects alone, and the person skilled in the art could consider other solutions.

According to the present disclosure, the support plates 10 are assembled integrally with each other by alignment means. More particularly, the support plates 10 are assembled so that each support plate 10 has one of its main faces opposite a main face of a support plate 10 that is directly adjacent to it. Furthermore, a spacing E may be imposed between two adjacent support plates.

Figure 3:
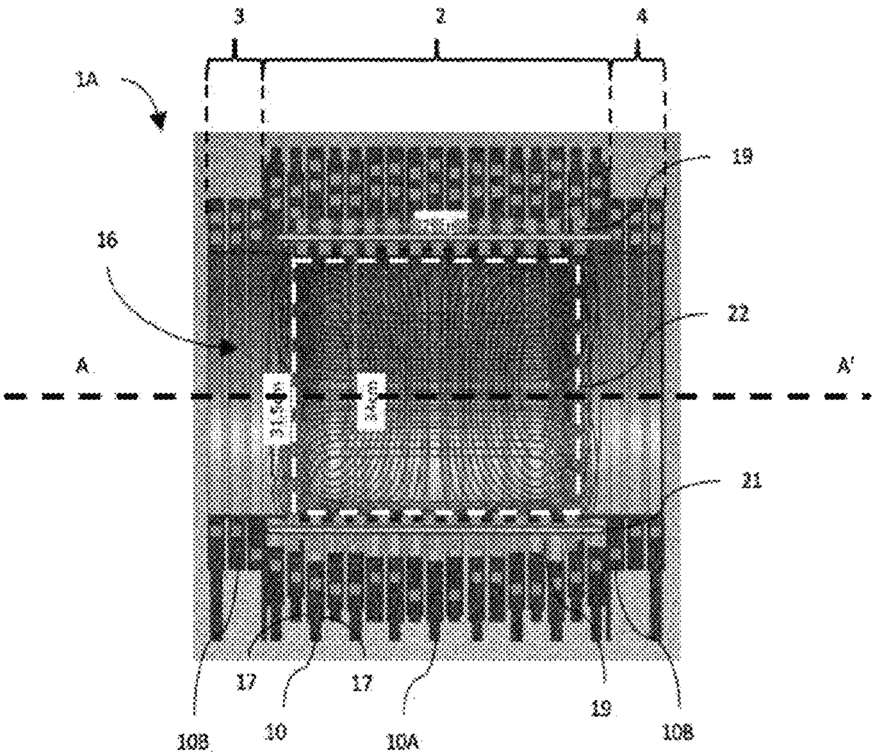
FIG. 3 is a cross-sectional view along a cutting plane passing through the main axis of the magnetic assembly according to a first variant of the first embodiment of the present disclosure.

According to this configuration, the annular sections 11 delimit a housing, called the main recess 16, of generally cylindrical shape around a main axis AA' (FIG. 3). More particularly, the support openings 12 are aligned, and parallel to each other, along the main axis AA', so as to form the main recess 16.

All of the magnets of the first plurality of permanent magnets 13, according to annular Halbach arrays, create a primary magnetic field in a zone, called the analysis zone, of the main housing that presents a first uniformity.

Still according to this first embodiment, the magnetic assembly 1A also comprises cover plates 17 of generally planar shape and that also comprise an opening, called the covering opening, which can be circular.

In particular, each support plate 10 is associated with two cover plates 17 specific to the respective support plate 10. In particular, each support plate 10 is clamped between two cover plates 17. More particularly, when the cover plates 17 enclose a given support plate 10, they are configured to retain the magnets 13 in the first recesses 14 of the respective support plate 10.

The cover plates 17 may comprise a non-magnetic material and, in particular, aluminum, or a plastic material, for example, PMMA plexiglass.

It is understood, without it being necessary to specify it, that the covering opening has a shape and dimensions that are similar to those of the main opening. In other words, the shape and dimensions of the covering opening do not define the main housing as considered in the present disclosure.

The magnetic assembly 1A may comprise a main part 2 inserted between two secondary parts 3 and 4 (FIG. 3). In this respect, the main part 2 is formed by support plates 10, the main support plates 10A, while both secondary parts 3 and 4 are formed of secondary support plates 10B. More particularly, the support opening 12 of the main support plates 10A, called first opening, has a first diameter, while the second support opening 12 of the secondary support plates 10B, has a second diameter smaller than the first diameter.

Figure 5:
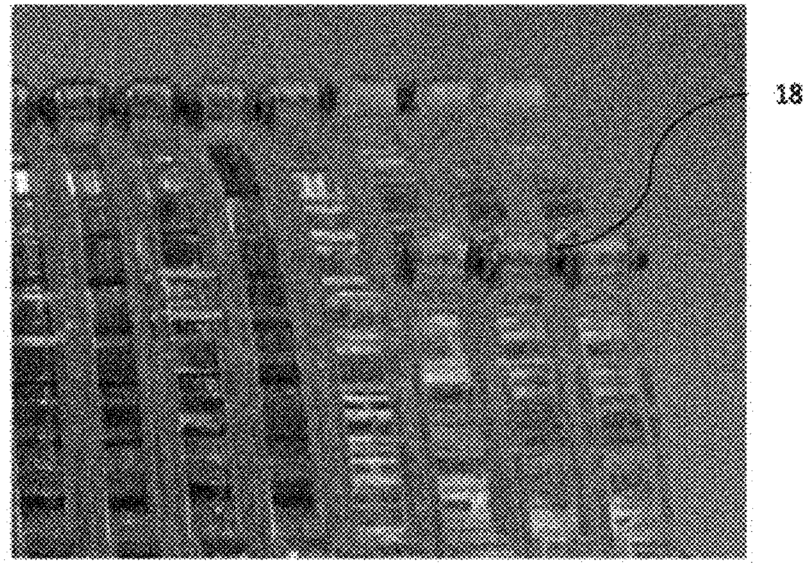
FIG. 5 is an enlarged view of a portion of the photograph of FIG. 1.

Still according to this first embodiment, the alignment means comprise threaded rods 15 oriented essentially parallel to the main axis AA' and holding the support plates 10 (FIG. 1) together. In this respect, the support plates 10 and the cover plates may comprise holes through which the threaded rods 15 pass. Thus, and advantageously, each support plate 10 is enclosed between the two cover plates by clamping means, the clamping means advantageously comprising nuts 18 cooperating with the threaded rods (FIG. 5). Nuts 18 can be, in particular, configured to maintain the spacing E between the adjacent support plates.

The magnetic assembly 1A may also comprise at least one alignment passage, for example, two alignment passages that extend parallel to the main axis AA', and of section (in a plane parallel to the main axis AA') or rectangular. The alignment passage can be, in particular, formed by a succession of openings, called alignment openings, passing through the support plates 10 on the side. It is understood that the cover plates 17 also comprise alignment openings.

Figure 6:
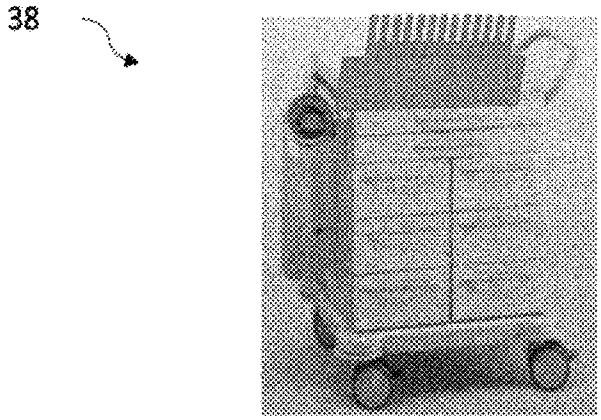
FIG. 6 is a photograph of a piston capable of being implemented within the scope of the present disclosure.
Figure 7:
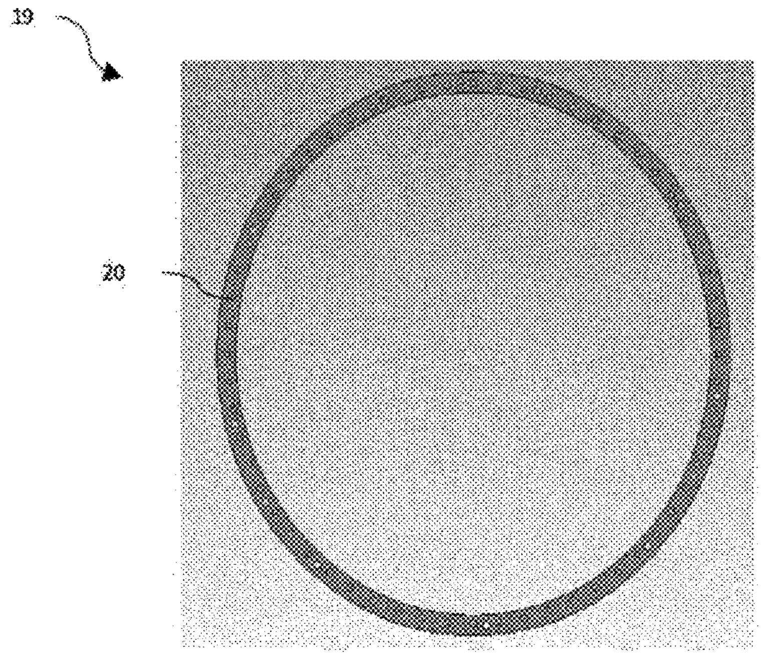
FIG. 7 is a representation of a piston capable of being implemented within the scope of the present disclosure.

The magnetic assembly 1A can also comprise at least one alignment tube 50 passing through the alignment passage and having a shape in accordance with the cross-section of the passage (FIG. 1). The at least one alignment tube 50 makes it possible to secure the magnetic assembly 1A to a trolley 38 of a magnetic resonance imaging apparatus 1 (FIG. 6).

The magnetic assembly 1A also comprises a plurality of annular parts 19 arranged coaxially to the annular sections 11 and secured to the support plates 10. For example, the annular parts 19 are held together and the plurality of support plates by threaded rods, called auxiliary threaded rods 21 (FIG. 3).

In a first variant of the first embodiment, the annular parts 19 are arranged in the main recess 16 (FIG. 3).

Figure 4:
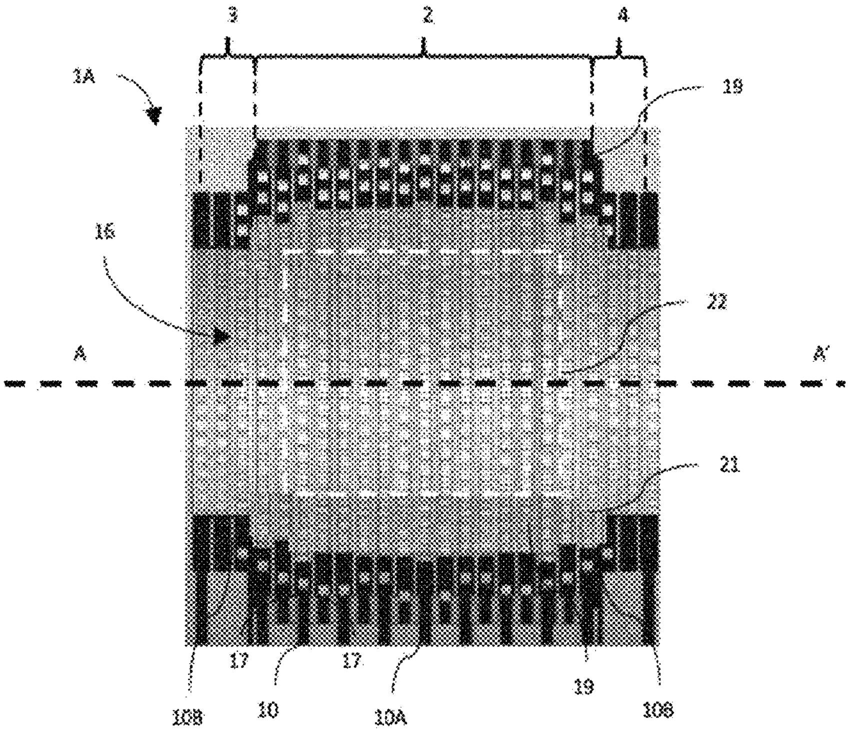
FIG. 4 is a cross-sectional view along a cutting plane passing through the main axis of the magnetic assembly according to a second variant of the first embodiment of the present disclosure.

According to a second variant of the first embodiment shown in FIG. 4, the annular parts 19 are arranged externally to the main recess 16. In particular, each annular part 19 is inserted between two support plates 10.

Each annular part 19 comprises two faces, called auxiliary faces, and parallel to the main faces of the support plates 10. Second recesses 20 are formed in each of the annular parts 19. More particularly, the second recesses 20 of an annular part 19 open by one and the other of the auxiliary faces of the annular part under consideration.

The magnetic assembly 1A also comprises a second plurality of permanent magnets. The choice of these magnets is left to the assessment of a person skilled in the art.

Each permanent magnet of the second plurality of permanent magnets is individually housed in the second housing.

Furthermore, and according to the present disclosure, the annular parts 19 are arranged so as to create a secondary magnetic field in the analysis zone 22 so that the resultant of the primary magnetic field and of the secondary magnetic field, called main field, in the analysis zone, has a second improved uniformity with regard to the first uniformity.

The analysis zone 22 corresponds to an internal volume defined by the annular parts 19.

The arrangement of the magnets of the second plurality of permanent magnets can be determined by implementing a digital simulation method, and more particularly implementing a genetic algorithm. The person skilled in the art wishing to implement a genetic algorithm may, in particular, take up the principles described in the following article: S. Binia and S. S. Sathya, "SurveyBio inspired Optimization Algorithms," International Journal of Soft Computing and Engineering, vol. 2, issue 2, pp. 137-151, May 2012.

According to an advantageous variant, the support plates 10 comprise internal 23 or external (not shown) tabs wherein housings capable of accommodating one or several permanent magnets are formed (FIG. 2).

The latter aspect also makes it possible to reduce the non-uniformity of the main magnetic field in the analysis zone.

Figure 8:
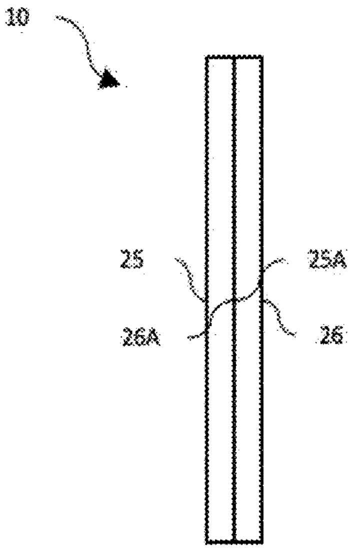
FIG. 8 is a schematic representation, according to a profile view (view perpendicular to a main face), of a support plate according to a second embodiment of the present disclosure.

FIG. 8 is a schematic representation of a support plate 10 capable of being implemented in a second embodiment of the present disclosure. This second embodiment essentially takes up the principles and terms of the first embodiment.

More particularly, this second embodiment differs from the first embodiment in that the implementation of the cover plates is not considered. The spacing E between two adjacent support plates 10 is always considered in this second embodiment.

Thus, and according to this second embodiment, a support plate 10, as shown in FIG. 8, comprises a first plate 25 and a second plate 26.

In particular, the first plate 25 and the second plate 26 are assembled together by a contact face. In particular, the first plate 25 comprises a first contact face 25A, while the second plate 26 comprises a second contact face 26A in contact with the first contact face 25A.

The assembly of the first plate 25 with the second plate 26 may implement, in particular, a set of screws.

Figure 9:
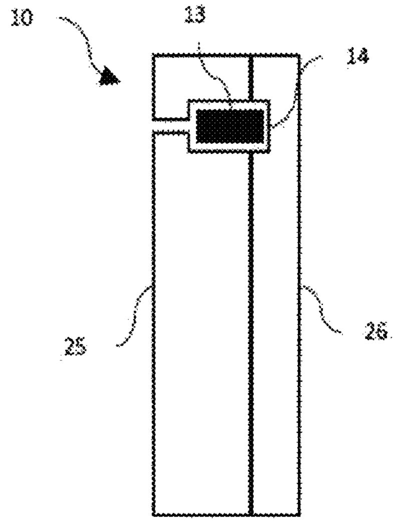
FIG. 9 is a view along a cutting plane of a first recess according to the second embodiment of the present disclosure.

According to this second embodiment, each first recess 14 is formed by a first cavity 14A and a second cavity 14B formed respectively in the first plate 25 and the second plate 26 (FIG. 9).

More particularly, the first cavity 14A emerges at the first contact face 25A, while the second cavity 14B emerges at the second contact face 26A.

It is understood that the face opposite the first contact face 25A of the first plate 25 forms one of the main faces of the support plate, while the face opposite the second contact face 26A of the second plate 26 forms the other of the main faces of the support plate.

Figure 10:
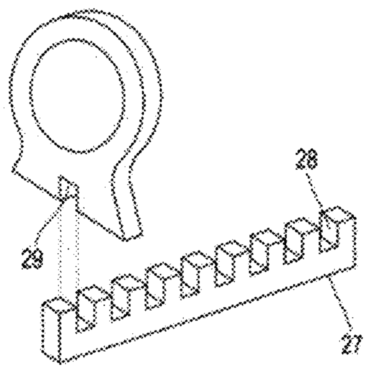
FIG. 10 is an illustration of an alignment means formed by a rail according to a perspective view.

According to a variant of the embodiments presented above, the alignment means comprise at least one rail 27 provided with alignment notches 28 (FIG. 10). Each alignment notch 28 is configured, in particular, to hold a support plate 10. In this respect, the support plate 10 may also comprise a notch, called the alignment notch 29, configured to cooperate with the alignment notch 28.

Advantageously, the alignment notches 28 are configured to maintain a predetermined spacing into two adjacent support plates 10. Furthermore, the rail 27 can be fixed to the support plates 10 with screws.

Figure 11:
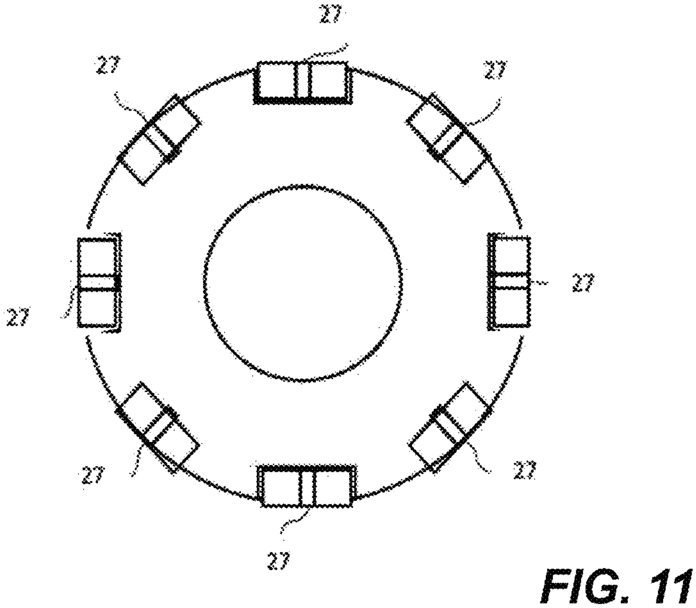
FIG. 11 is a view along a cross-sectional plane perpendicular to the main axis A-A' (FIGS. 3 and 4) of the magnetic assembly provided with alignment means formed by eight rails.

As shown in FIG. 11, it is also possible to consider several rails 27, distributed around the magnetic assembly 1A and now all of the support plates 10 at different angular positions around the main axis AA'.

Figure 12:
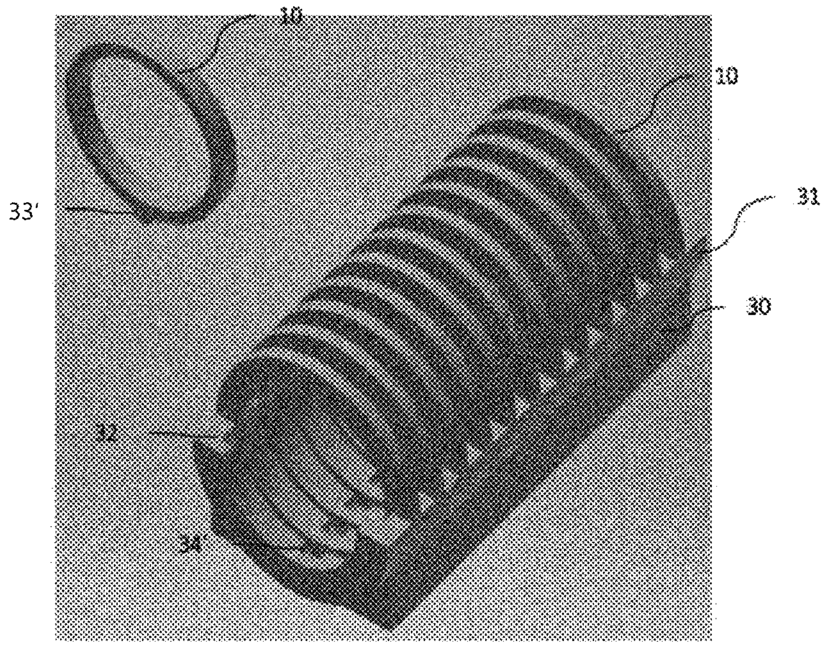
FIG. 12 is an illustration of an alignment means formed by a cradle according to a perspective view.

FIG. 12 shows another alternative embodiment of the alignment means. In particular, the alignment means according to this variant comprise a base 30 topped by a cradle 31. In this respect, the cradle 31 comprises a cylinder portion with grooves 32 formed on an inner surface thereof. In particular, each groove 32 is intended to receive a support plate 10.

Advantageously, each support plate 10 comprises an external tongue 33' that extends radially from the annular section and is inserted into a cavity 34' formed at the bottom of the groove holding the support plate.

The arrangements proposed in the present disclosure make it possible to ensure the overall cohesion of the magnetic assembly 1A. Indeed, the first plurality of magnets, as well as the second plurality of magnets, generates magnetic forces likely to lead to mechanical instability of the magnetic assembly. The implementation of the holding means as described in the present disclosure makes it possible to compensate for these effects.

Moreover, the consideration of the annular parts 19 makes it possible to compensate, at least in part, the inhomogeneities of the main magnetic field imposed in the analysis zone.

Figure 13:
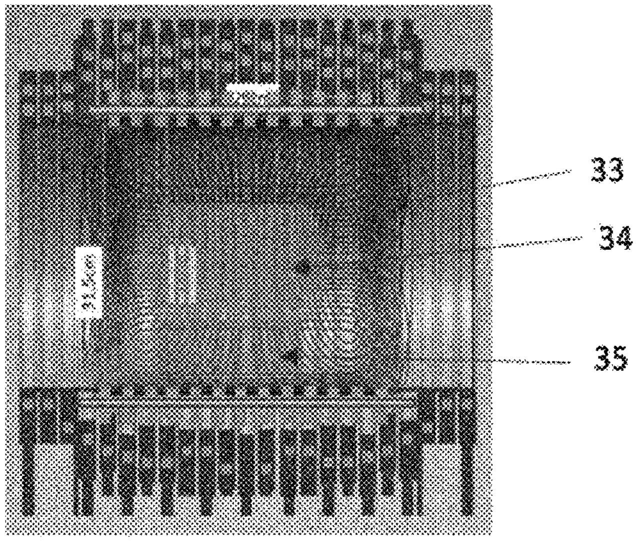
FIG. 13 is an illustration of a magnetic assembly provided with a RF coil and gradient coil.

Regardless of the embodiment considered, and as shown by way of example in FIG. 13, the magnetic assembly 1A can also comprise a radiofrequency (RF) coil 34 and gradient coils 33 held by a support 35. More particularly, the RF coil 34 and the gradient coils 33 are held by the support 35 in the main housing. Advantageously, the RF coil 34 and the gradient coils 33 are interchangeable and confer a modular character to the magnetic assembly 1A.

The gradient coils are configured to produce small-amplitude magnetic fields and vary in space when a current is applied thereto. More particularly, the gradient coils are designed to produce a magnetic field component that is aligned parallel to the main magnetic field and that varies linearly in amplitude with the position along one of the axes x, y, or z (with each pair of axes x, y, and z being perpendicular). Thus, the combined effects of the magnetic fields imposed by the gradient coils make it possible to spatially encode each of the positions of the body intended to be probed.

The RF coil is intended to act as an RF transceiver. In particular, the RF coil is configured to emit RF energy pulses of a frequency equal to or close to the resonance frequency of the hydrogen nuclei spins and that is at least partially absorbed by these nuclei. As soon as the RF emission is interrupted, the nuclear spins relax in order to return to their initial energy state and in turn emit an RF signal capable of being collected by at least one RF coil. This RF signal is then processed using a computer and reconstruction algorithms in order to obtain an image of the body.

The imaging apparatus 1 according to the present disclosure forms a modular system. More particularly, the imaging apparatus 1 may comprise at least a first module 36 and a second module 37.

Each first module 36 (from among one or more first modules) is, in particular, formed by the magnetic assembly 1A and a trolley 38. The trolley 38 may comprise castors.

The trolley 38 is, in particular, provided with a plate 39 on a face, called the upper face, on which the magnetic assembly 1A is attached. The trolley comprises two side walls 40 and 41 supporting, by one of their edges, called an upper edge, the plate 39.

The two side walls 40 and 41 delimit, with the plate 39, a receiving space 42.

The second module 37 comprises a console, of essentially parallelepiped shape, supporting a set of electronic control elements of the apparatus, the console is configured, in particular, to be inserted into the receiving space 42. In this respect, the console can comprise casters allowing it to be inserted into the home space.

In particular, the lateral flanks 43 and 44 are in a sliding connection with, respectively, the side wall 40 and the side wall 41. In this respect, the apparatus may comprise a system of slide guides for sliding and locking the lateral flanks 43 and 44 against, respectively, the side wall 40 and the side wall 41. The slide system may comprise, in particular, one or two slides 45*a*, 45*b*. In this respect, one or two slides 45*a*, 45*b* are intended to cooperate with rails 46*a* and 46*b* arranged on both side walls 40 and 41. The rails 46*a* and 46*b* may also be provided with locking means making it possible to lock the second module in the receiving space 42. Locking means may comprise shims 47*a* and 47*b*.

Figure 14:
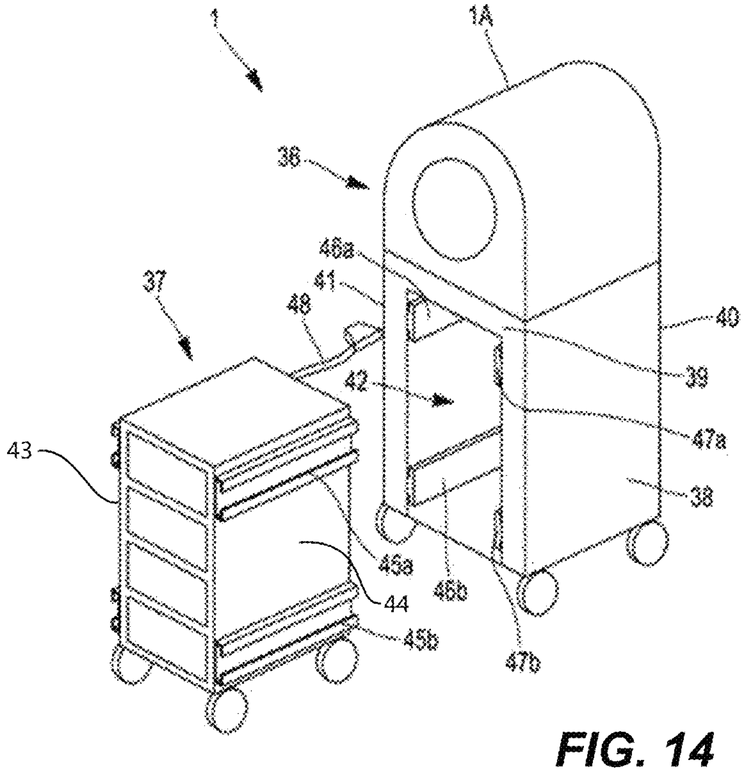
FIG. 14 is an illustration of the first module and of the second module.
Figure 15:
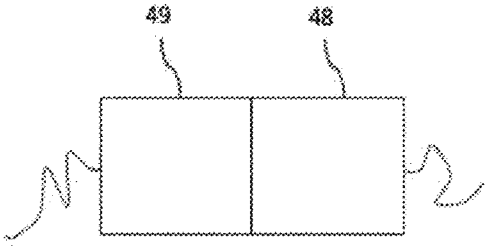
FIG. 15 is a schematic representation of the male plug and the female plug.

Finally, the imaging apparatus 1 also comprises connection means making it possible to connect the first module 36 and the second module 37. The connection means are, in particular, plug-in means that comprise a male plug 48 and a female plug 49 (FIGS. 14 and 15). In particular, the male plug 48 is associated with the second module 37 while the female plug 49 is associated with the first module 36.

Both modules of the console and the at least a first module comprise means for identifying, by the console, geometric and magnetic features of the magnetic assembly of the first module, the identification means being integrated into connection means of the console and of the first module. Identification means refers to means enabling the console to recognize the geometric and magnetic features of the magnetic assembly. This aspect, in particular, allows the console to recognize the configuration of the imaging apparatus.

Figure 16:
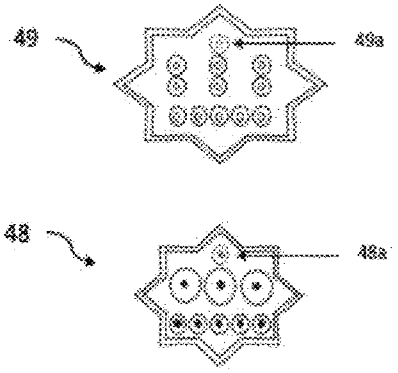
FIG. 16 is another schematic representation of the male plug and the female plug.

Each of the male plugs 48 and female plugs 49 of complementary shape, may have a star shape (FIG. 16). The latter may also comprise a port, called the identification port 48*a* and 49*a* (the identification port is associated, in particular, with the identification means), making it possible to identify the type of first module connected to the second module.

The identification function may involve digital means (for example, a chip ID, e.g., RFID in the female plug and an ID reader in the second module), or analog means (for example, a combination of resistors in the female plug, and an ammeter in the second module).

The male plug 48 and female plug 49 comprise other ports associated with the RF coil controls and gradient coils.

Such a configuration makes the imaging apparatus 1 modular and makes it possible to consider different specific magnetic assemblies. In particular, it is possible according to the present disclosure to consider different magnetic assemblies, each magnetic assembly being intended to image a specific part of a body.

The present disclosure also relates to a method for manufacturing a magnetic assembly of an imaging apparatus 1 by magnetic resonance according to the present disclosure, the method comprising:

a step of forming the support plates;

step of forming the annular parts;

step of assembling the support plates and the annular parts;

The method being characterized in that the number and the positioning the annular parts, as well as the amount of magnets forming each second plurality of magnets, are determined by the implementation of a genetic algorithm configured so that the resultant of the primary magnetic field and of the secondary magnetic field, called main field, in the analysis zone, has a second uniformity to be improved with respect to the first uniformity.

Of course, the disclosure is not limited to the described embodiments and variant embodiments may be envisaged without departing from the scope of the invention as defined by the claims.

The invention claimed is:

1. A magnetic resonance imaging apparatus comprising:

at least one first module, each first module from the at least one first module comprising a trolley having a plate with an upper face, a magnetic assembly resting on the upper face, the magnetic assembly configured to impose a main magnetic field in an analysis zone of a main housing of the magnetic assembly, the trolley further comprising two side walls supporting the plate by an upper edge;

a second module including a substantially parallelepiped console supporting a set of electronic control elements of the imaging apparatus, the console configured to be inserted, by a sliding connection, between the two side walls of the trolley of each first module from the at least one first module; and wherein the at least one first module and the second module comprise means for identifying, by the console, geometric and magnetic features of the magnetic assembly of the at least one first module, the means for identifying being integrated into connection means of the console and of the at least one first module.

2. The imaging apparatus of claim 1, wherein the magnetic assembly comprises:

a plurality of support plates, each support plate of the plurality having an annular section delimiting a support opening, the plurality of support plates being assembled together, by alignment means, along a main axis, so that the support openings, aligned along the main axis, delimit a main housing of generally cylindrical shape, each support plate of the plurality further comprising a first plurality of permanent magnets, housed in first housings provided in the annular section, according to at least one annular Halbach array around the main axis, a set of magnets of the first plurality of permanent magnets creating a primary magnetic field in an analysis zone of the main housing that has a first uniformity; and a plurality of annular parts assembled coaxially with the annular section, and integral with the plurality of support plates, each annular part comprising a second plurality of magnets housed in second housings provided in each annular part, the plurality of annular parts being arranged so as to create a secondary magnetic field in the analysis zone so that a resultant main field of the primary magnetic field and of the secondary magnetic field in the analysis zone has a second improved uniformity with regard to the first uniformity.

3. The imaging apparatus of claim 1, wherein the magnetic assembly further comprises a radiofrequency coil and gradient coils arranged in the main housing and mechanically integral with the magnetic assembly.

4. The imaging apparatus of claim 2, wherein the magnetic assembly comprises a main part inserted between two secondary parts, the main part being formed of main support plates, and the two secondary parts being formed from secondary support plates, a first opening of the main support plates has a first diameter, while a second opening of the secondary support plates has a second diameter smaller than the first diameter.

5. The imaging apparatus of claim 2, wherein the support plates comprise a non-magnetic material.

6. The imaging apparatus of claim 2, wherein the alignment means comprises threaded rods at least substantially parallel to the main axis and rigidly connecting the support plates together.

7. The imaging apparatus of claim 2, wherein each support plate of the plurality comprises a first plate and a second plate assembled against one another by a contact face, each first housing comprising two cavities formed from the contact face of one and/or an other of the first plate and the second plate.

8. The imaging apparatus of claim 2, wherein the annular parts are held together with the plurality of support plates by threaded rods.

9. The imaging apparatus of claim 2, wherein the support plates of the plurality comprise inner or outer tabs having housings capable of housing one or several permanent magnets.

10. The imaging apparatus of claim 2, wherein the annular parts are arranged in the main housing.

11. The imaging apparatus of claim 2, wherein the annular parts are arranged externally to the main housing, each annular part being inserted between two support plates of the plurality of support plates.

12. The imaging apparatus of claim 3, wherein the radiofrequency coil and the gradient coils are removable.

13. The imaging apparatus of claim 6, wherein each support plate of the plurality is enclosed between two cover plates, the two cover plates being configured to retain the magnets of the first plurality of permanent magnets in the first housings of the support plates of the plurality of support plates.

14. The imaging apparatus of claim 7, wherein the alignment means comprise at least one rail provided with alignment notches, each alignment notch holding a support plate of the plurality of support plates, the alignment notches being configured to maintain a predetermined spacing into two adjacent support plates of the plurality of support plates.

15. The imaging apparatus of claim 7, wherein the alignment means comprises an alignment element provided with a base surmounted by a cradle forming a cylinder portion having grooves on an inner surface thereof, each of the support plates of the plurality of support plates being held in a respective groove of the grooves.

16. The imaging apparatus of claim 5, wherein the non-magnetic material comprises aluminum or a plastic material.

17. The imaging apparatus of claim 13, wherein each support plate of the plurality comprises an alignment opening so that the magnetic assembly comprises at least one alignment passage of square or rectangular cross-section formed by the alignment opening and that extends parallel to the main axis, the magnetic assembly further comprising at least one alignment tube passing through the at least one alignment passage, and having a shape corresponding to the cross-section of the at least one alignment passage, the at least one alignment tube being intended to fix the magnetic assembly to the trolley.

18. The imaging apparatus of claim 15, wherein each support plate of the plurality of support plates comprises an outer tongue that extends radially from the annular section and that is inserted into a cavity at a bottom of the groove holding the respective support plate of the plurality of support plates.

19. The imaging apparatus of claim 16, wherein the non-magnetic material comprises PMMA.

20. The imaging apparatus of claim 13, wherein the alignment means comprises nuts cooperating with the threaded rods.

* * * * *